(12) United States Patent
Hynecek et al.

(10) Patent No.: US 8,471,315 B1
(45) Date of Patent: Jun. 25, 2013

(54) CMOS IMAGE SENSOR HAVING GLOBAL SHUTTER PIXELS BUILT USING A BURIED CHANNEL TRANSFER GATE WITH A SURFACE CHANNEL DARK CURRENT DRAIN

(75) Inventors: Jaroslav Hynecek, Allen, TX (US); Hirofumi Komori, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 57 days.

(21) Appl. No.: 13/154,428

(22) Filed: Jun. 6, 2011

Related U.S. Application Data

(60) Provisional application No. 61/438,111, filed on Jan. 31, 2011.

(51) Int. Cl.
*H01L 31/062* (2006.01)
*H01L 31/113* (2006.01)

(52) U.S. Cl.
USPC .............. 257/292; 257/233; 257/E27.132

(58) Field of Classification Search
USPC .................... 257/292, 233, E27.132
See application file for complete search history.

(56) References Cited

U.S. PATENT DOCUMENTS

| 4,900,688 | A | * | 2/1990 | Halvis .................. 438/144 |
| 5,625,210 | A | | 4/1997 | Lee et al. |
| 6,657,665 | B1 | | 12/2003 | Guidash et al. |
| 7,214,974 | B2 | * | 5/2007 | Shin .................. 257/225 |

OTHER PUBLICATIONS

Yasutomi, Keita et al. "A 2.7e Temporal Noise 99.7% Shutter Efficiency 92 dB Dynamic Range CMOS Image Sensor with Dual Global Shutter Pixels." ISSCC Digest of Technical Papers pp. 398,399 (2010).

* cited by examiner

*Primary Examiner* — Stephen W Smoot
*Assistant Examiner* — Vicki B Booker
(74) *Attorney, Agent, or Firm* — David C. Kellogg

(57) ABSTRACT

The invention describes a solid-state CMOS image sensor array and in particular describes in detail image sensor array pixels having global and rolling shutter capabilities that are using a dual channel transfer-storage gate for charge transfer from a PD to a TX gate well and from the TX gate well onto a FD. The dual channels are stacked above each other where a shallow charge channel is used to drain surface generated dark current away from the pixel structure, while a buried bulk channel provides for standard charge transfer and storage functions. This feature thus improves the sensor noise performance and prevents signal contamination and various shading effects caused by the dark current buildup during a prolonged charge storage sequence in pixels of image sensor arrays using the global shutter mode of operation. Several embodiment of this concept are described including pixels which utilize shared circuitry, a complete PD reset capability, and an efficient anti-blooming control.

20 Claims, 6 Drawing Sheets

CMOS IMAGE SENSOR HAVING GLOBAL SHUTTER PIXELS BUILT USING A BURIED CHANNEL TRANSFER GATE WITH A SURFACE CHANNEL DARK CURRENT DRAIN

CROSS REFERENCE TO RELATED APPLICATION

This applications claims priority under 35 USC Sec. 119 (e)(1) of provisional application No. 61/438,111 filed on Jan. 31, 2011.

BACKGROUND OF THE INVENTION

1. Field of the Invention

The disclosed invention relates to solid-state image sensors and more specifically to small pixel size CMOS image sensors that have global shutter (GS) and rolling shutter (RS) capabilities.

2. Description of Related Art

Typical image sensors sense light by converting impinging photons into electrons that are integrated (collected) in the sensor pixels. After completion of the integration cycle collected charge is converted into a voltage, which is supplied to the output terminals of the sensor. In CMOS image sensors the charge to voltage conversion is accomplished directly in the pixels themselves and the analog pixel voltage is transferred to the output terminals through various pixel addressing and scanning schemes. The analog signal can also be converted on-chip to a digital equivalent before reaching the chip output. The pixels have incorporated in them a buffer amplifier, typically a Source Follower (SF), which drives the sense lines that are connected to the pixels by suitable addressing transistors. In some designs the SF itself may also be used in an addressing function. After charge to voltage conversion is completed and the resulting signal transferred out from the pixels, the pixels are reset in order to be ready for accumulation of new charge. In pixels that are using Floating Diffusion (FD) as the charge detection node, the reset is accomplished by momentarily turning on a reset transistor that conductively connects the FD node to a voltage reference, which is typically the pixel drain node. This step removes collected charge; however, it generates kTC-reset noise as is well known in the art. The kTC noise has to be removed from the signal by the Correlated Double Sampling (CDS) signal processing technique in order to achieve the desired low noise performance. The typical CMOS sensors that utilize the CDS concept usually require at least three or four transistors (4T) in the pixel. An example of the 4T pixel circuit with pinned photodiode can be found in the U.S. Pat. No. 5,625,210 to Lee, which patent is incorporated herein by reference.

In modern CMOS sensor designs the circuitry for several photodiodes may be shared as can be found for example in U.S. Pat. No. 6,657,665 B1 to Guidash, which patent is also incorporated herein by reference. In this patent the pixel consists of two photodiodes located in the neighboring rows that share the same circuitry. Such shared circuit concept can result in having fewer metal bus lines in the row direction and column direction per photodiode. The circuit sharing is very useful for designing small pixels or pixels with high Fill Factor (FF) since the spacing and the width of the metal lines essentially determines the minimum pixel size.

The principal disadvantage of the standard CMOS sensors is that the pixel scanning, after charge has been accumulated in them, is performed in a sequential manner row by row. This generates the exposure time skew, which can be observed in the pictures of moving object and which causes an undesirable picture distortion. This method of CMOS sensor scanning is called the "rolling shutter" mode and it resembles the action of the focal plane slit shutter in the old photographic film cameras. In most applications, however, it is preferable to expose all the pixels of the image at the same time without the skew and thus eliminate the distortion of moving objects. This type of sensor operation is called the "global shuttering", which resembles the operation of a mechanical iris shutter in the old film cameras. In order to implement this kind of global shuttering it is necessary to provide another charge storage site in the pixels. After charge is integrated in the photodiodes of the pixels it is transferred to the pixel storage sites simultaneously in all the pixels of the array where it can wait for the scanning in the row by row fashion. The pixel scanning time skew is thus independent of the frame pixel exposure time. There have been several methods published in the literature how to incorporate additional charge storage sites into the CMOS sensor pixels. The recent publication described in: ISSCC Digest of Technical Papers pp. 398, 399, by Keita Yasutomi, Shinya Itoh, Shoji Kawahito entitled: "A 2.7e Temporal Noise 99.7% Shutter Efficiency 92 dB Dynamic Range CMOS Image Sensor with Dual Global Shutter Pixels", is a modification of the well known Interline Transfer CCD concept where charge from the pixel photodiodes is transferred first into vertical CCD registers located in the space between the pixels and then from there transferred in parallel fashion row by row into the serial register followed by the CCD transfer out into the common single amplifier. The application of the CCD charge transfer concept into a CMOS sensor to implement the global shutter is shown in FIG. 1.

The drawing 100 in FIG. 1 represents the simplified cross section of a pixel of the CMOS sensor that has the global shuttering capability. After charge integration is completed in a pinned photodiode 101 charge is transferred via the transfer gate transistor 103 into the second pinned photodiode 102 where it waits for scanning. The charge transfer from the first to the second pinned diode is completed in a CCD fashion without generating any kTC noise. It is also necessary that the second pinned photodiode has a higher pinning voltage than the first pinned photodiode or the transfer gate 103 has a potential barrier 104 and a well 105 incorporated in it. It is also necessary that the charge storage pinned photodiode 102 is well shielded from the impinging photons to prevent undesirable smear effects when the objects in the scene move. The signal charge readout from the second pinned photodiode 102 then proceeds in the standard way by first resetting the Floating Diffusion (FD) node 106 to the drain bias voltage by momentarily turning on the reset transistor followed by pulsing the charge transfer transistor gate 107. The PD 101 can also be reset by turning on the anti-blooming reset gate (AB) 108 thus allowing the collected charge to flow out into the drain 109. During the charge integration time the AB reset gate bias is adjusted such that, for the pixels with maximum illumination, charge overflows the barrier 110 and flows into the drain thus preventing spreading into the neighboring pixels. The pixel readout sequence in this device can now proceed in a sequential order row by row. The signal appearing of the FD is buffered by the standard source follower transistor. Using the pinned photodiodes for charge storage is advantageous since it is well known that these diodes have a low dark current generation. The high dark current in the storage sites would add to noise and also would generate undesirable shading effects in the picture that would have to be compensated for. Unfortunately, the second pinned photodiode consumes a significant amount of valuable pixel area, thus increasing the size of the sensor and ultimately its cost. This concept also consumes a large amount of the voltage budget that is available for the pixel operation. It is thus desirable to investigate other possibilities of how to build the CMOS sensors with the global shuttering capability that consumes less pixel area do not sacrifice the pixel performance and operate with low voltages.

SUMMARY OF THE INVENTION

It is an object of the disclosed invention to overcome limitations in the prior art. It is a further object of the disclosed invention to provide a practical CMOS image sensor design that has a small pixel size, can operate in the rolling shutter mode as well as in the global shutter mode with low dark current, and with low power supply voltage. One possibility described in this disclosure is to use a transfer gate for charge storage. However, the standard transfer gate has a problem of large dark current generation at the interface between the silicon and silicon-dioxide, which would significantly degrade the sensor performance. It is therefore desirable to provide a novel transfer gate which incorporates two charge channels in a stacked fashion above each other where the shallow channel collects the dark current and drains it away thus preventing signal degradation, while the underlying bulk charge transfer channel is used for charge transfer and storage of charge from the PD and also transfers it into the FD during the readout sequence in the standard way.

BRIEF DESCRIPTION OF THE DRAWINGS

The invention will be described in detail in the following description of the preferred embodiments with reference to the following figures wherein.

DETAILED DESCRIPTION OF THE PREFERRED EMBODIMENTS

Figure 1:
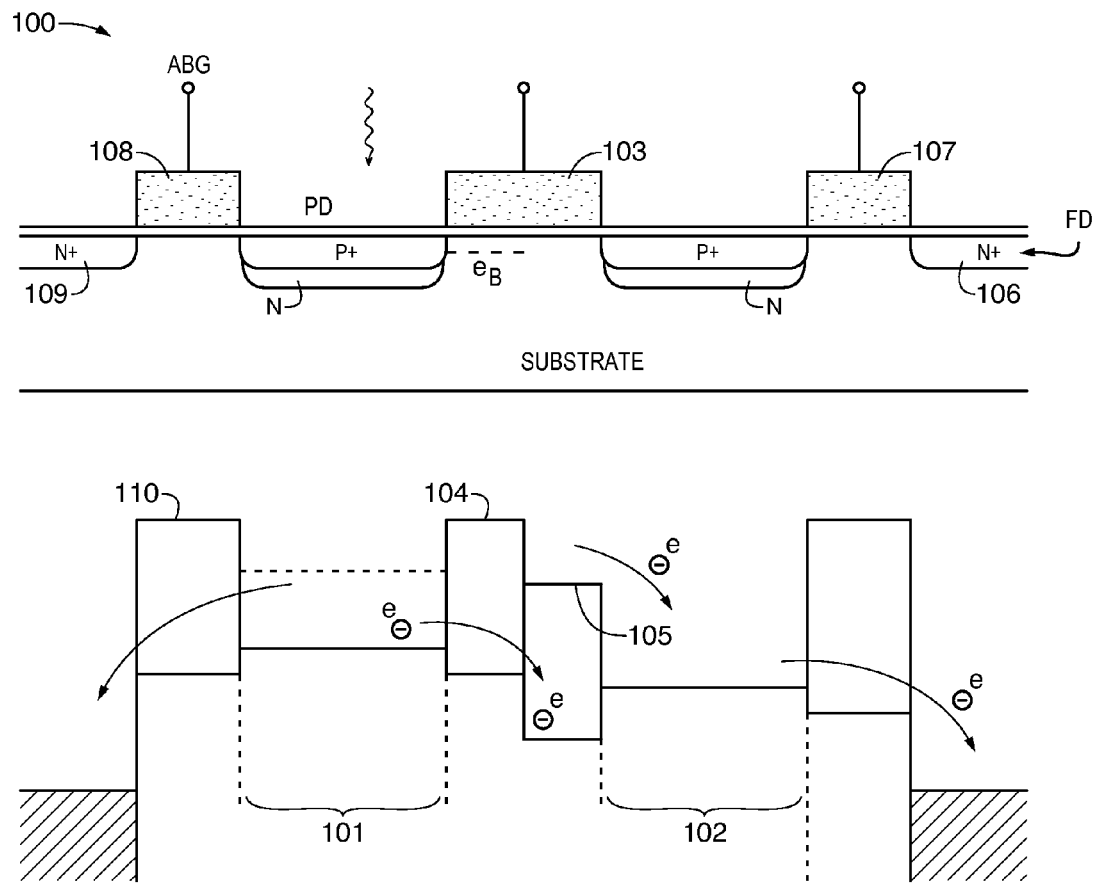
FIG. 1 shows the simplified cross section of the prior art design of a CMOS sensor pixel that has the global shutter capability by using a second pinned photodiode for charge storage.
Figure 2:
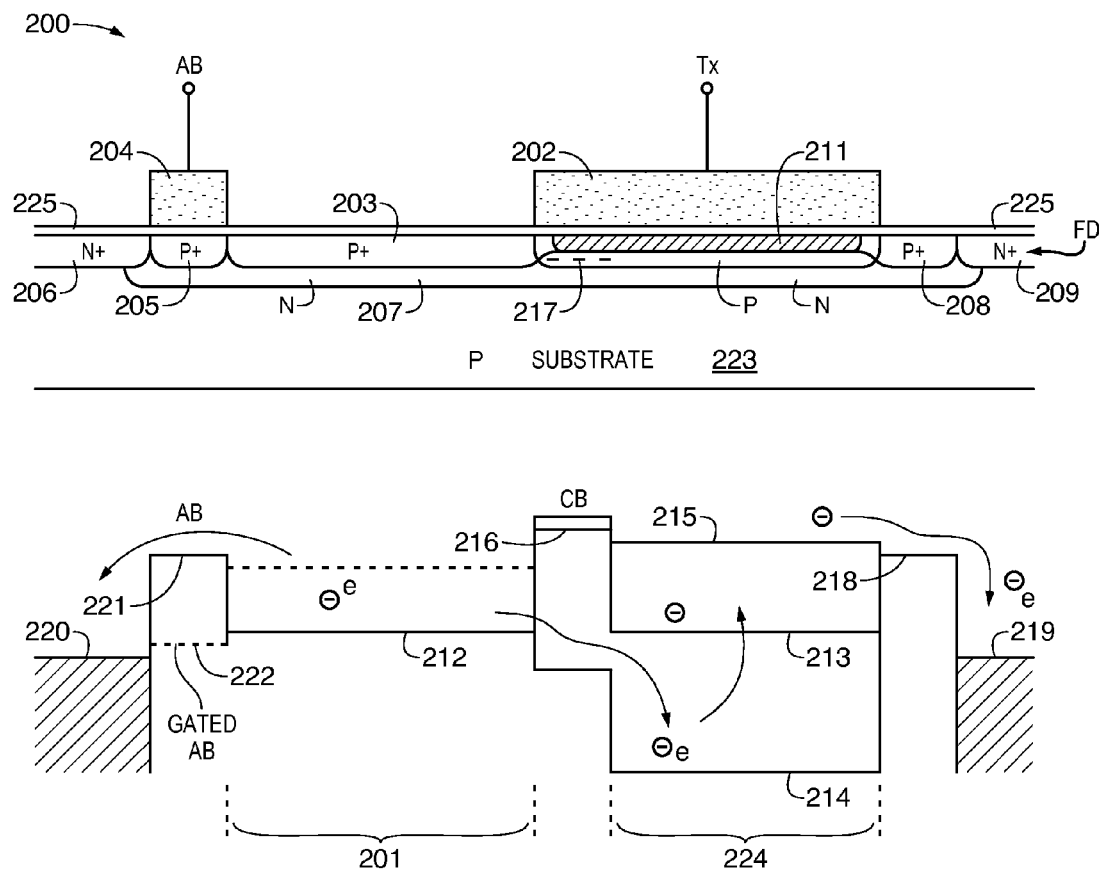
FIG. 2 shows the simplified pixel cross section of the present invention with the stacked channel transfer gate for charge transfer and storage in the direction from the photodiode to the FD and for the continuous dark current drain.

The drawing 200 in FIG. 2 is a simplified cross section of a pixel of the present invention with associated simplified potential diagram drawn in the direction from the PD to the FD. The pixel consists of a pinned photodiode region 201, the transfer-storage gate region (TX) 202, the storage well (SW) region 224, the pinned barrier region (PB) 208, and the FD region 209. The p substrate 223 has a p+ doped layer 203 placed close to its surface that forms a part of the pinned photodiode PD. Another n doped layer 207 is shown extending from the PD under the transfer-storage gate region TX and under the p+ pinned charge transfer barrier (PB) 208 all the way to the FD region 209. The entire surface of the pixel is covered by an oxide layer 225 that isolates the TX gate 202 from the substrate 223. Another gate 204 can be placed adjacent to the pinned photodiode 201 that serves as a PD reset gate. This gate 204 also establishes the potential barrier 221 for the blooming control. When the pixel needs to be reset the (AB) gate 204 is biased at a high level, which moves the blooming barrier 221 to the reset level 222. This clears all charge from the pixel and allows it to flow into the n+ drain 206 biased at the level 220. The reset of all the pixels in the array can be made at the same time, which is necessary for the global shutter operation. This action marks the beginning of the charge integration time. In another embodiment of the invention the AB gate 204 can be omitted and replaced by a p+ doped AB region 205. This also establishes the AB level 221, which is, however, fixed and cannot be lowered. In addition to the n type doping layer 207, p type barriers 210 and 217 are implanted into the substrate 223 in a region beneath the transfer-storage gate region 202. The implant 217 forms a clocked barrier CB, which prevents charge from flowing back to the PD when the bias of the TX gate is lowered. A region 211 under the TX gate 202 is a channel that collects dark current charge generated at the silicon-silicon dioxide interface and drains it in the direction perpendicular to the drawing into another drain (not shown). This drain will be shown in more detail in FIG. 3. When the TX gate 202 is biased high the potential profile 214 under the gate results and this allows electrons from the PD to flow under the TX gate 202 into a storage well region 224. This action marks the end of the integration time. After completion of charge transfer, the gate 202 is biased at an intermediate bias level, which results in the potential level 213. Thus electrons are stored under the gate between the CB region at potential 216 and the pinned barrier (PB) region 208 at potential 213. The charge transfer from the photodiode PD is made for all pixels of the array simultaneously thus providing the global shutter capability. When charge is ready to be read out the TX gate 202 bias is lowered to its minimum value, which results in the potential level 213 to change to level 215 thus causing electrons to flow from the storage well region 224 across the pinned barrier region 208 at potential 218 into the n+ FD region 209. The FD region 209, which has been previously reset to potential level 219, changes its potential level according to the amount of charge transferred on it and this is the desired signal that is buffered by the source follower transistor and made available for readout by the CDS circuitry. The pixel charge readout from the storage well region 224 is in a sequential mode, row by row, as in any standard CMOS sensor with a rolling shutter mode of operation. If a rolling shutter readout for this sensor is also desired, the charge transfer into the storage well under the TX gate can also be made sequentially, row by row including the PD reset.

Figure 3:
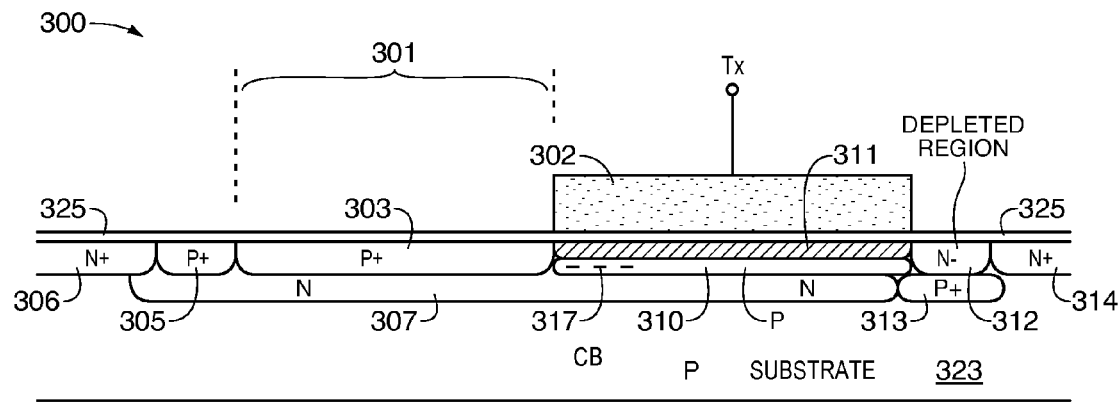
FIG. 3 shows the simplified pixel cross section of the present invention with the stacked channels transfer gate for charge transfer and storage in the direction from the photodiode to the dark current drain.

The drawing 300 in FIG. 3 is a simplified cross section of a pixel in the direction from the PD to a dark current drain region 314. The regions 301, 302, 303, 305, 306, 307, 310, 311, 317, and 323 correspond to the identical regions 201, 202, 203, 205, 206, 207, 210, 211, 217, and 223 in FIG. 2. The new structures are the n− region 312, p+ region 313, and the n+ dark current drain region 314. The p+ region 313 prevents charge, from the bulk channel region 310, from escaping to the n+ dark current drain region 314. This region 313 thus generates the required potential barrier for this purpose. The n− region 312 is lightly doped and forms a drift region for the dark current generated carriers to flow to the n+ drain region 314 which is biased at a constant Vdd voltage bias. Since the bias of the TX gate changes it is important that the potential under it is uniform and not affected by the drain bias. The potential under the TX gate thus always follows the gate bias and any difference from the drain bias is absorbed in the drift region 312. This feature also guaranties that no potential pockets are formed under the TX gate that would cause the signal charge from the PD to be trapped under the gate and cause an image lag. The potential profile under the TX gate is shown in FIG. 4.

Figure 4:
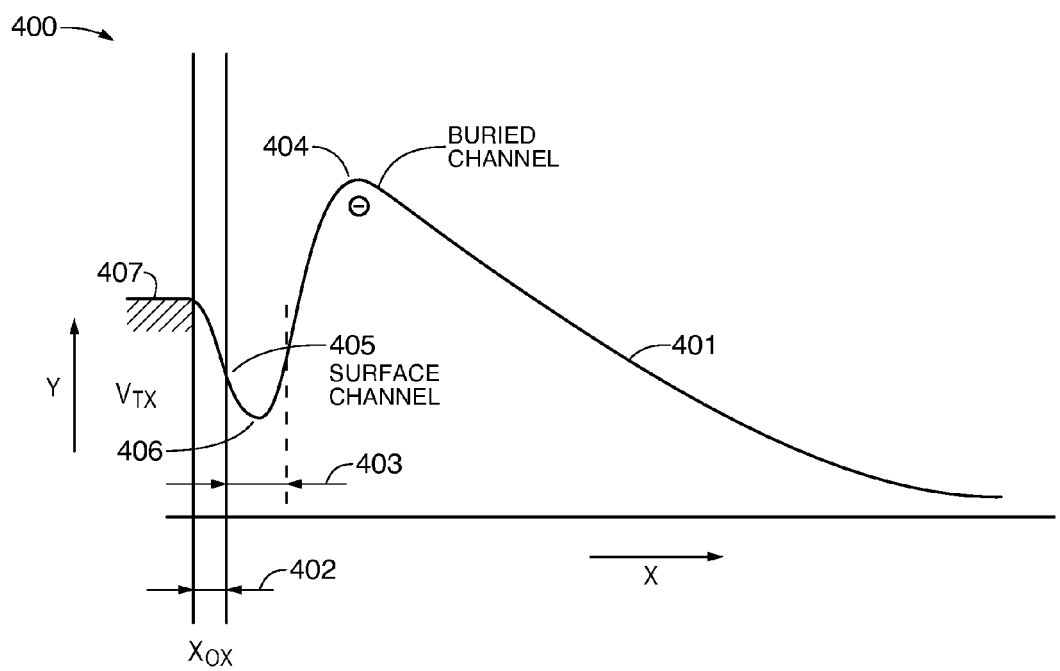
FIG. 4 shows the graph of the potential profile under the transfer gate.

The drawing 400 in FIG. 4 is one example of a suitable potential profile 401 existing under the TX gate 302 that forms the surface channel potential 405 and the buried channel potential 404. The channels are separated by a barrier 406 that is formed by the p-doping of buried channel region 310. The depth of the p− doping is indicated by the region 403 in the graph. The oxide thickness is indicated by the region 402. When the bias level 407 of the TX gate changes the potential profile follows this change, but the potential barrier, difference between the potential levels 405 and 406, always remains the same to confine the surface state generated electrons in the surface channel region 311. Since these electrons are constantly drained away and do not accumulate in this surface channel region 311, they do not significantly change its potential. The well capacity of this surface channel region can thus be minimal and at most accommodate only tens or hundreds of electrons. The well capacity of the buried channel region, which is the n doped region under the region 310, on the other hand needs to be large to accommodate all the transferred electrons from the PD and store them there. To satisfy this requirement is easier than in the prior art where the storage PD needs to be approximately the same size as the illuminated PD, thus essentially doubling the pixel size. The fact that the storage gate is clocked also reduces the requirement for the pixel voltage budget and the pixel with the same well capacity can operate with a lower Vdd bias thus greatly reducing the power consumption.

Figure 5:
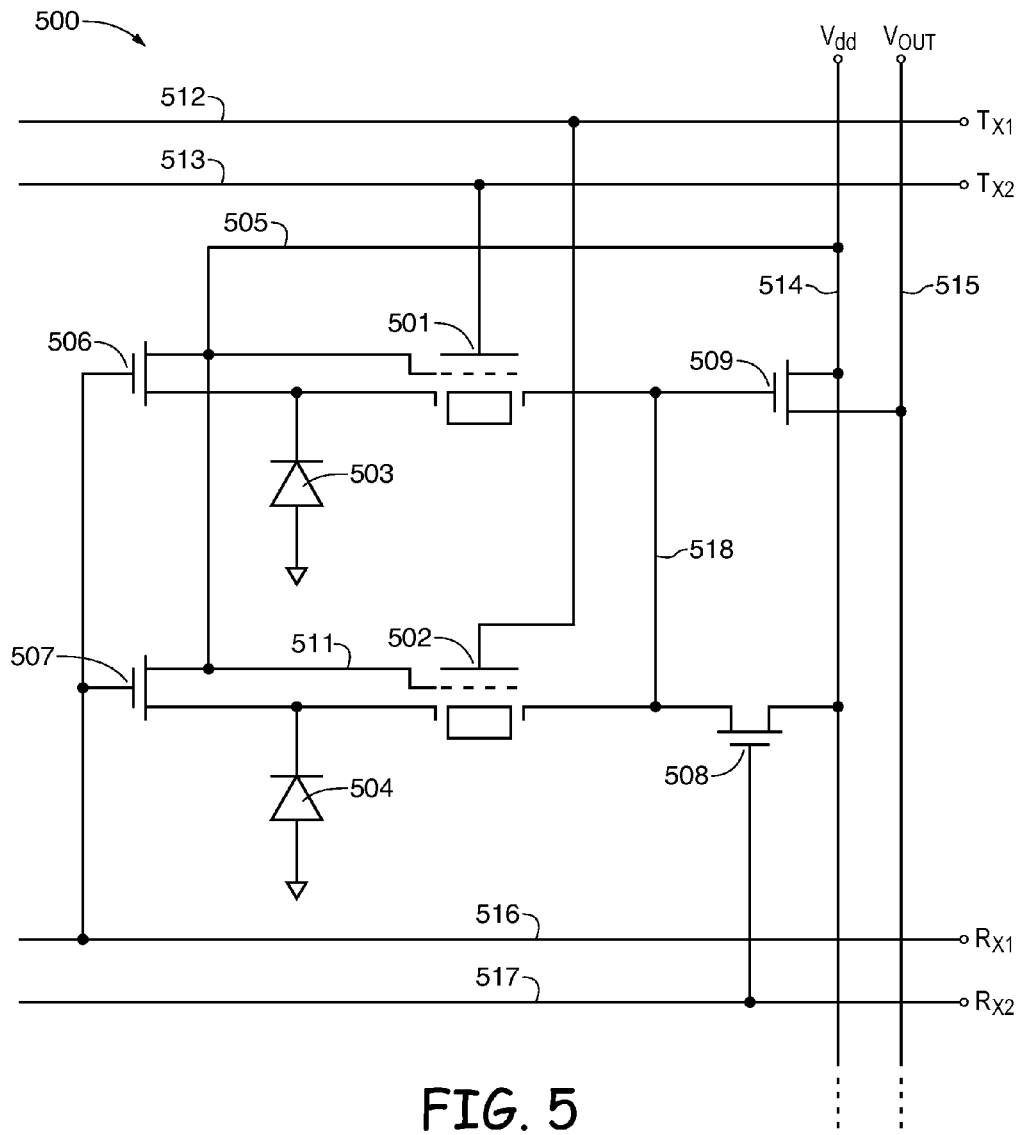
FIG. 5 is the simplified circuit diagram on the pixel of the present invention where some of the circuit elements are shared between the two photodiodes of neighboring rows with corresponding TX gates. The shared elements are: the FD, the reset transistor, the source follower transistor, and the anti-blooming PD reset gate. The charge storage wells and the surface generated dark current drains are also indicated in the figure.

A simplified circuit diagram 500 of two pixels in neighboring rows with shared components is shown in FIG. 5. The PDs 503 and 504 are connected to corresponding transfer-storage gates 501 and 502. The dark current drains from each TX gate are connected via lines 510 and 511 to the pixel drain bus 505 and further to the column Vdd bus 514 that also supplies the Vdd bias to the SF transistor 509. The pixel drain bus 505 also supplies bias to the anti-blooming photodiode reset transistors 506 and 507. The common FD corresponds to the node 518 and is reset by the reset transistor 508 to the Vdd bias level. The SF transistor 509 buffers the signal appearing on the FD and its source drives the output column bus 515. The row bus lines 512 and 513 drive the transfer gates and the row bus lines 516 and 517 drive the reset gates. The shared pixel requires two row bus lines and two column bus lines per pixel, which results in a compact and efficient pixel layout.

In another embodiment of the invention it is also possible to add a row select transistor to the pixel circuit, which is not shown in the drawing. When the row select transistor is added, another horizontal addressing line must be added to the pixel circuit, to control this transistor gate.

Figure 6:
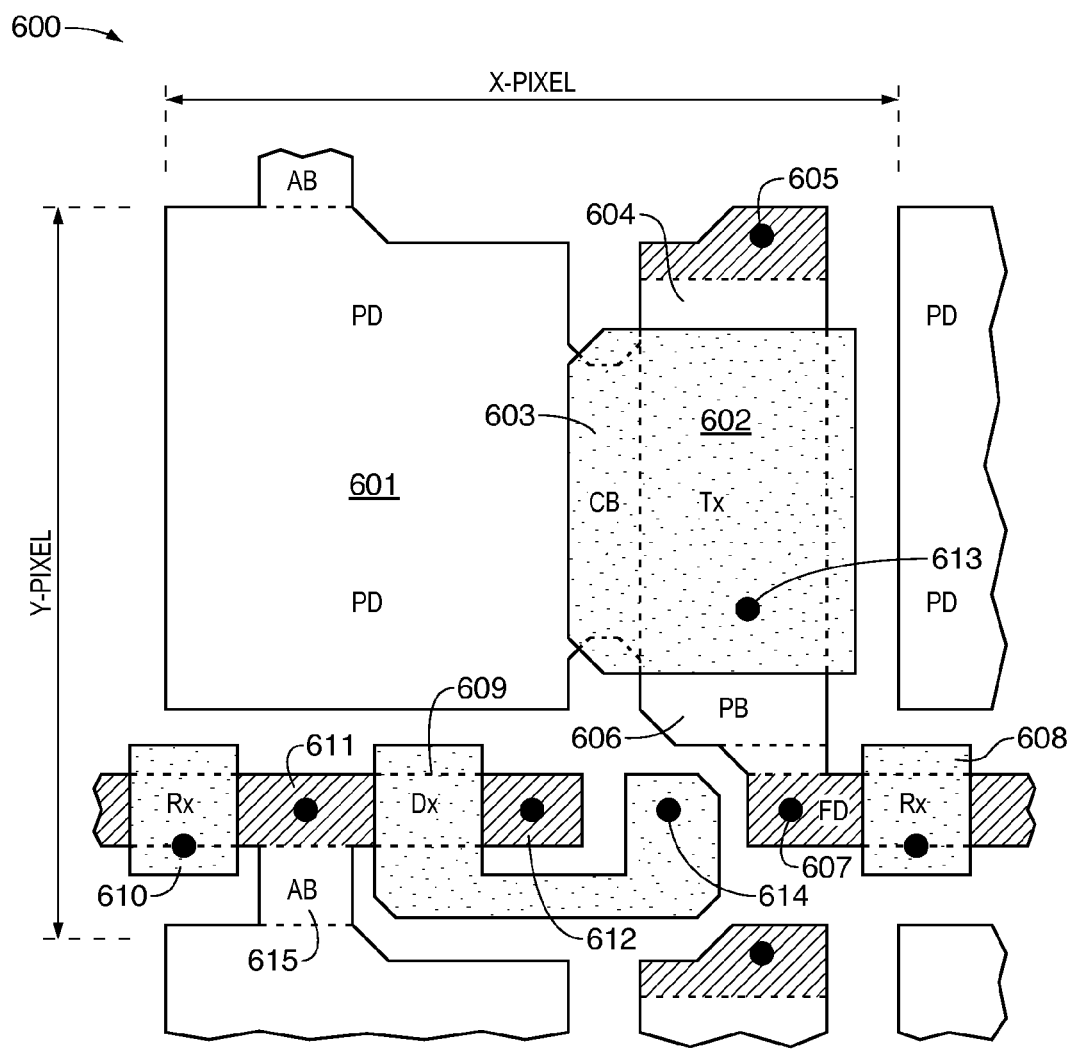
FIG. 6 is an example of the simplified drawing of the top view topology of the CMOS sensors pixel layout showing the photodiode outline, the overflow anti-blooming transistor location, the transfer and storage gate with the clocked barrier, floating diffusion with the pinned charge transfer barrier, reset transistor, source follower transistor and dark current drain with the lightly doped charge drift region. The contact openings to metal bus lines are also shown, but the metal buss lines themselves are for simplicity omitted.

An example of one possible embodiment of the invention showing a pixel layout that does not have shared circuits and has a fixed AB barrier is shown in FIG. 6. The simplified drawing 600 is a pixel top view topology indicating the outline of various pixel regions. The region 601 is the PD area that is exposed to light. The TX gate region 602 has a clocked barrier 603 located at the interface under the TX gate and is interfacing with the PD. The lightly doped n− type doped drift region 604 interfaces with the n+ charge drain region 605 and the TX gate. The openings in the oxide layer, which covers the whole pixel area (not visible in the drawing) to provide the electrical connections to these various regions are indicated by black circles such as, for example, circles 613 and 614. The metal wiring has been omitted in this figure in order not to unnecessarily clutter the drawing. The FD is the region 607 that interfaces with the pinned barrier 606 and the reset transistor. The gate of the reset transistor is the region 608. This transistor shares the common drain 611 with the source follower transistor with gate 609 and the anti-blooming barrier region 615. The gate of the SF transistor 609 is extended to be closer to the FD region in order to simplify the metal wiring that can be realized now with only two metal layers.

Figure 7:
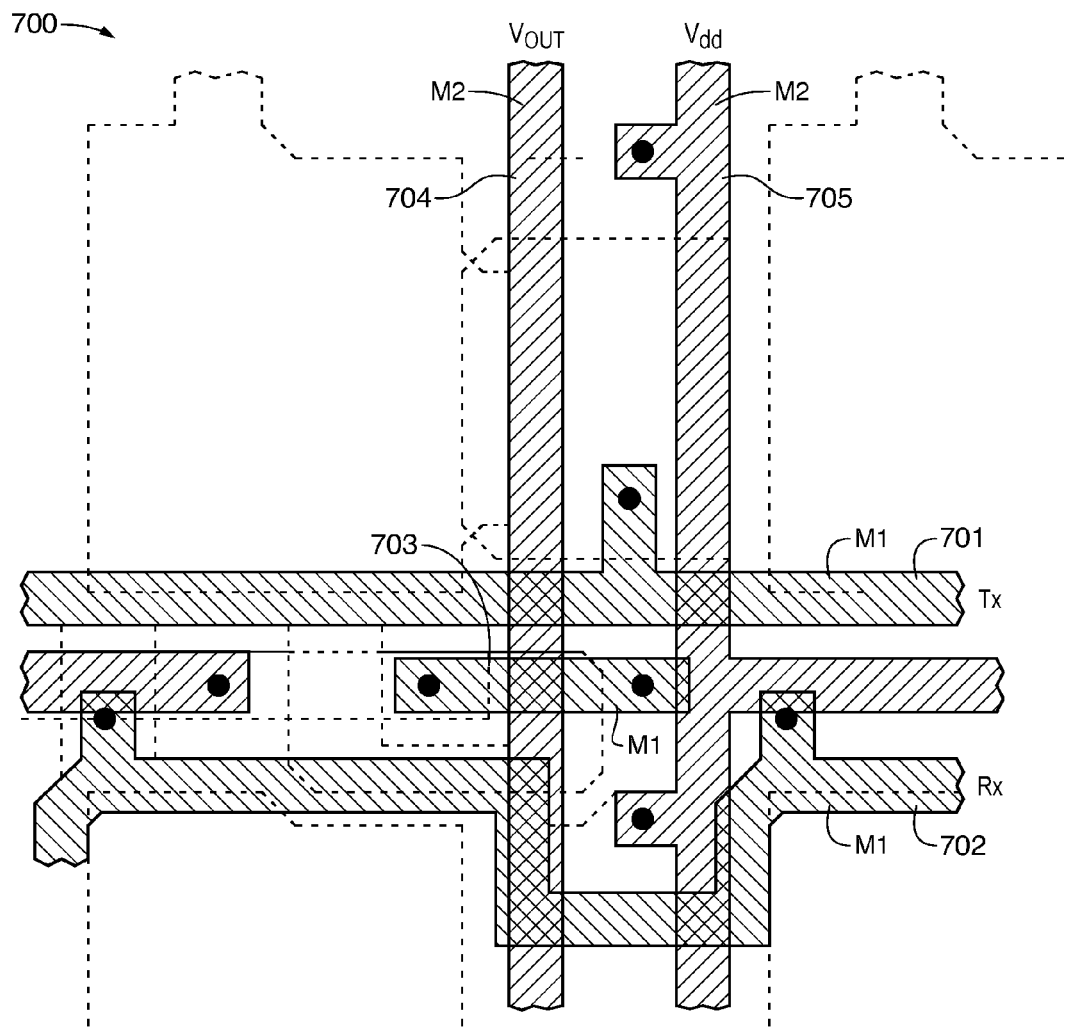
FIG. 7 shows the same drawing as in FIG. 6, but with the metal lines added.

The wiring of the pixel of FIG. 6 is shown in FIG. 7. The diagram 700 represents the simplified top view of the pixel where the first metal level M1 is forming the connections 701, 702, and 703. The row bus 701 thus connects all the TX gates of the same row together and to the driver circuits located at the edge of the array. The row bus 702 connects all the reset gates together in one row and also connects them to the driver located at the edge of the array. The pixel local interconnection 703 connects the FD to the gate of the SF transistor. The second metal level M2 is used for the column bussing. The bus 704 supplies the pixel signal to the CDS circuits located at the periphery of the array and the column bus 705 provides the Vdd bias to the dark current drain, to the reset transistor drain, and to the SF transistor drain.

There are many modifications possible to the disclosed invention and to the particular embodiments described by the above drawings. This is well known to all those skilled in the art, however, the key and main points of this invention that are novel is the structure of the transfer-storage gate that has the ability to transfer and also store charge received from the PD and has two charge channels stacked above each other. The shallow, surface charge channel, is used for collection and draining away the interface generated dark current, while the deeper buried bulk charge transfer channel is used for storing and transferring charge from the PD as well as from the TX well onto the floating diffusion (FD). The TX gate is operated by applying three distinct bias levels: first during the high bias level charge is transferred from the PD into the TX gate well, second, during the mid-bias level, charge is stored in the TX gate well, and third, during the low bias level, the stored charge in the TX gate well is transferred onto the floating diffusion (FD). The above pixel structure thus allows the charge storing function to be performed efficiently without undue sacrifice of valuable pixel area and without adding any significant amount of dark current to the stored signal. The pixels can be operated the standard way using the Correlated Double Sampling (CDS) signal processing method to remove kTC noise which results in high pixel performance.

Having thus described the preferred embodiments of the novel pixel for the image sensor array that has a global shutter capability and low dark current using the dual channel transfer and charge storage gate, which are intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by the claims.

Having thus described the invention with the details and particularity required by the patent laws, what is claimed and desired protected by Letters Patent is set forth in the appended claims.

What is claimed is:

1. A CMOS image sensor pixel array having at least one pixel circuit, wherein the at least one pixel circuit comprises:
    a photodiode;
    a floating diffusion;
    a reset transistor;
    a source follower transistor, and
    a transfer gate having a transfer-storage gate region beneath said transfer gate, wherein said transfer-storage gate region includes a shallow surface charge channel and a deep buried charge channel located below the shallow surface charge channel and wherein the shallow surface charge channel is used to drain surface generated dark current away from said transfer gate region and wherein the deep buried charge channel is used to accumulate charge transferred from the photodiode, then store said transferred charge, and subsequently transfer said charge out to the floating diffusion for signal readout.

2. The CMOS image sensor pixel array of claim 1 wherein the at least one pixel circuit also includes an addressing transistor.

3. The CMOS image sensor pixel array of claim 1 wherein the at least one pixel circuit includes an anti-blooming structure with a fixed charge overflow barrier.

4. The CMOS image sensor pixel array of claim 1 wherein the at least one pixel circuit includes an anti-blooming structure with an overflow barrier controlled by a gate that can also be used to remove all charge from the photodiode and thus determine a start of a charge integration time independently of a time of charge transfer from the photodiode.

5. The CMOS image sensor pixel array of claim 1, wherein said transfer-storage gate region includes a clocked barrier region interfacing with the photodiode and the deep buried charge channel such that stored charge is prevented from flowing back to the photodiode when a bias of the transfer gate is lowered.

6. The CMOS image sensor pixel array of claim 1 wherein the at least one pixel circuit includes a pinned barrier interfacing with the transfer-storage gate region and the floating diffusion.

7. The CMOS image sensor pixel array of claim 6, wherein the at least one pixel circuit further includes a clocked barrier under the transfer-storage gate region, wherein the transfer gate is operated by three level bias: a first high level bias that causes charge to be transferred from the photodiode over the clocked barrier to the transfer-storage region, a mid-level bias that is used for charge storage in the transfer-storage region for prolonged times, and a low level bias that causes charge to be transferred from the transfer-storage region over the pinned barrier onto the floating diffusion.

8. The CMOS image sensor pixel array of claim 7 operated in a global shutter mode wherein all pixel photodiodes in the array were reset simultaneously by the anti-blooming gate in a prior time and wherein the high level bias is now applied to all the transfer-storage gates of the array simultaneously and wherein the low level bias is applied to the sensor array pixel rows in a sequential manner to read the pixel signal in a column parallel mode row by row.

9. The CMOS image sensor pixel array of claim 7 operated in a rolling shutter mode wherein all pixel photodiodes in the array were reset sequentially by the anti-blooming gate in a prior time and wherein the high level bias is also applied to all the transfer-storage gates of the array sequentially and wherein the low level bias is applied to the sensor array pixel rows in a sequential manner to read the pixel signal in a column parallel mode row by row.

10. The CMOS image sensor array of claim 6 further including a drift region interfacing with the shallow surface charge channel and a drain region, wherein said drift region is doped such that dark current generated carriers continuously flow from said surface charge channel to said drain irrespective of a bias of the transfer gate.

11. The CMOS image sensor pixel array of claim 1 wherein the floating diffusion, the source follower transistor, and the reset transistor are shared between at least two pixels in neighboring rows.

12. The CMOS image sensor pixel array of claim 1 further including a drift region interfacing with the shallow surface charge channel and a drain region, wherein said drift region is doped such that dark current generated carriers continuously flow from said surface charge channel to said drain irrespective of a bias of the transfer-storage gate.

13. A CMOS image sensor pixel array having at least one pixel circuit, wherein the at least one pixel circuit comprises:
    a photodiode;
    a floating diffusion;
    a reset transistor;
    a source follower transistor, and
    a transfer-storage gate region beneath a transfer gate, wherein said transfer-storage gate region includes a shallow surface charge channel and a deep buried charge channel located below the shallow surface charge channel and wherein the shallow surface charge channel is used to drain surface generated dark current away from said transfer-storage gate region and wherein the deep buried charge channel is used to accumulate charge transferred from the photodiode when a high level bias is applied to the transfer gate, then store said transferred charge in said deep buried charge channel after a mid-level bias is applied to said transfer gate, and subsequently transfer said charge out to the floating diffusion for signal readout after a low level bias is applied to said transfer gate.

14. The CMOS image sensor pixel array of claim 13 wherein the at least one pixel circuit also includes an addressing transistor.

15. The CMOS image sensor pixel array of claim 13 wherein the at least one pixel circuit also includes an anti-blooming structure with a fixed charge overflow barrier.

16. The CMOS image sensor pixel array of claim 13 wherein the at least one pixel circuit includes an anti-blooming structure with an overflow barrier controlled by a gate that can also be used to remove all charge from the photodiode and thus determine the start of a charge integration time independently of the time of charge transfer from the photodiode.

17. The CMOS image sensor pixel array of claim 13, wherein said transfer-storage gate region includes a clocked barrier region interfacing with the photodiode and the deep buried charge channel such that stored charge is prevented from flowing back to the photodiode when a bias of the transfer gate is lowered.

18. The CMOS image sensor pixel array of claim 13 wherein the least one pixel circuit includes a pinned barrier interfacing with the transfer-storage gate region and the floating diffusion.

19. The CMOS image sensor pixel array of claim 13 wherein the floating diffusion, the source follower transistor, and the reset transistor are shared between at least two pixels in neighboring rows.

20. The CMOS image sensor pixel array of claim 13 further including a drift region interfacing with the shallow surface charge channel and a drain region, wherein said drift region is doped such that dark current generated carriers continuously flow from said surface charge channel to said drain irrespective of the transfer-storage gate bias.

* * * * *